United States Patent
Lee et al.

(10) Patent No.: US 9,142,317 B2
(45) Date of Patent: Sep. 22, 2015

(54) EMBEDDED MEMORY DEVICE AND MEMORY CONTROLLER INCLUDING THE SAME

(71) Applicant: Samsung Electronics Co., Ltd., Suwon-Si, Gyeonggi-Do (KR)

(72) Inventors: Younggeun Lee, Seoul (KR); Youngjin Cho, Seoul (KR); Hyun-Wook Lee, Gimcheon-si (KR); Junghyo Woo, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/231,856

(22) Filed: Apr. 1, 2014

(65) Prior Publication Data

US 2014/0369137 A1 Dec. 18, 2014

(30) Foreign Application Priority Data

Jun. 18, 2013 (KR) .......................... 10-2013-0069740

(51) Int. Cl.
| | | |
|---|---|---|
| G11C 7/00 | (2006.01) | |
| *G11C 17/16* | (2006.01) | |
| *G11C 17/00* | (2006.01) | |
| G11C 11/00 | (2006.01) | |
| G06F 12/06 | (2006.01) | |
| G06F 13/16 | (2006.01) | |

(52) U.S. Cl.
CPC ................ *G11C 17/16* (2013.01); *G11C 17/00* (2013.01); *G06F 12/06* (2013.01); *G06F 13/1694* (2013.01); *G11C 11/005* (2013.01)

(58) Field of Classification Search
CPC .... G11C 11/005; G06F 12/06; G06F 13/1694
USPC .......... 365/189.2, 230.03, 230.08, 200, 225.7
See application file for complete search history.

(56) References Cited

U.S. PATENT DOCUMENTS

| | | | | | |
|---|---|---|---|---|---|
| 5,452,258 | A | * | 9/1995 | Hotta | ........................ 365/230.03 |
| 5,764,575 | A | * | 6/1998 | Kawai et al. | ................... 365/200 |
| 6,148,362 | A | | 11/2000 | Sagi | |
| 6,772,314 | B2 | | 8/2004 | Kashine | |
| 6,874,073 | B2 | | 3/2005 | Mahrla | |
| 6,882,585 | B2 | * | 4/2005 | Cho et al. | ........................ 365/200 |
| 7,239,563 | B2 | * | 7/2007 | Nakaya et al. | ................. 365/200 |
| 7,269,707 | B2 | | 9/2007 | Menon et al. | |
| 7,606,090 | B2 | * | 10/2009 | Nam et al. | ..................... 365/200 |

(Continued)

FOREIGN PATENT DOCUMENTS

| | | | |
|---|---|---|---|
| JP | H06131172 | A | 5/1994 |
| JP | H07287990 | A | 10/1995 |
| JP | H09185546 | A | 7/1997 |

(Continued)

*Primary Examiner* — Connie Yoha
(74) *Attorney, Agent, or Firm* — Harness, Dickey & Pierce, P.L.C.

(57) ABSTRACT

An embedded memory device includes a mask ROM including a plurality of mask ROM cells and an address decoder configured to decode an address of the plurality of mask ROM cells; and an e-fuse memory configured to replace a part of data stored in the mask ROM with replacement data, the e-fuse memory including, a plurality of e-fuse memory cells configured to store the replacement data, and an e-fuse address selector configured to decode an address of the plurality of e-fuse memory cells and to selectively cause data of one or more of the plurality of e-fuse memory cells to be output based on the decoding result.

17 Claims, 16 Drawing Sheets

(56) References Cited

U.S. PATENT DOCUMENTS

| | | |
|---|---|---|
| 7,672,150 B2 | 3/2010 | Sellar |
| 2011/0113216 A1 | 5/2011 | Toita et al. |

FOREIGN PATENT DOCUMENTS

| | | |
|---|---|---|
| JP | H11296365 A | 10/1999 |
| JP | 2010-182274 A | 8/2010 |

* cited by examiner

Fig. 8

| ADDR1 | DATA1 |
|-------|-------|
| ADDR2 | DATA2 |
| ADDR3 | DATA3 |
| ADDR4 | DATA4 |

EMBEDDED MEMORY DEVICE AND MEMORY CONTROLLER INCLUDING THE SAME

CROSS-REFERENCE TO RELATED APPLICATIONS

A claim for priority under 35 U.S.C. §119 is made to Korean Patent Application No. 10-2013-0069740 filed Jun. 18, 2013, in the Korean Intellectual Property Office, the entire contents of which are hereby incorporated by reference.

BACKGROUND

1. Field

At least some embodiments relate to a semiconductor memory device, and more particularly, relate to an embedded memory device and/or a memory controller including the embedded memory device.

2. Related Art

A mask ROM is a ROM in which data is at a factory level, for example, before use by a consumer. For example, programs are previously stored at a fabrication level. A memory information fixed read only memory element is a bipolar element or a metal oxide semiconductor (MOS) element. Information is stored according to whether a transistor is connected between an address line and a data line. This memory information is decided according to a mask pattern when elements are fabricated. Thus, a change of the memory information is impossible, the memory information is non-volatile, and the reliability on information maintenance is high. In the mask ROM, read only contents are fixed at a fabrication level. That is, it is impossible to revise data recorded in the mask ROM.

SUMMARY

According to at least one example embodiment, an embedded memory device, comprising: a mask ROM including a plurality of mask ROM cells and an address decoder configured to decode an address of the plurality of mask ROM cells; and an e-fuse memory configured to replace a part of data stored in the mask ROM with replacement data, the e-fuse memory including, a plurality of e-fuse memory cells configured to store the replacement data, and an e-fuse address selector configured to decode an address of the plurality of e-fuse memory cells and to selectively cause data of one or more of the plurality of e-fuse memory cells to be output based on the decoding result.

The embedded memory device may be configured such that a band width of the mask ROM is different from that of the e-fuse memory.

The embedded memory device may be configured such that the band width of the e-fuse memory is less than that of the mask ROM.

The embedded memory device may further comprise a plurality of multiplexers configured to receive data from the mask ROM and the e-fuse memory.

The embedded memory device may be configured such that the plurality of multiplexers is controlled by the e-fuse address selector.

The embedded memory device may be configured such that the plurality of multiplexers selects first data, the first data being at least one of the data received from the mask ROM and the data received from the e-fuse memory, and outputs the selected data externally from the embedded memory device.

The embedded memory device may be configured such that a band width of the data output from the embedded memory device is equal to that of the mask ROM.

The embedded memory device may be configured such that band widths of data of the e-fuse memory are variable according to an address.

According to at least one example embodiment, a memory controller includes an embedded memory device, the embedded memory device including, a mask ROM configured to store a firmware code; an e-fuse memory configured to replace a part of code data stored in the mask ROM with replacement data; and a plurality of multiplexers configured to receive code data from the mask ROM and the e-fuse memory and to selectively provide data of at least one of the mask ROM and data of the e-fuse memory.

The memory controller may be configured such that a band width of the mask ROM is different from that of the e-fuse memory.

The memory controller may be configured such that a band width of the e-fuse memory is less than that of the mask ROM.

The memory controller may be configured such that data of the mask ROM is distributed to the plurality of multiplexers.

The memory controller may be configured such that the e-fuse memory controls the plurality of multiplexers, the plurality of multiplexers being configured to selectively output data of the mask ROM or data of the e-fuse memory.

The memory controller may be configured such that a band width of data provided from the plurality of multiplexers is equal to that of the mask ROM.

The memory controller may be configured such that the embedded memory device receives an address from the memory controller, the address being provided to the mask ROM and the e-fuse memory.

According to at least one example embodiment, an embedded memory device includes a mask ROM configured to receive an address and output first data corresponding to the address; an e-fuse memory configured to receive the address, the e-fuse memory including, a plurality of data units, and an address selector configured to select, based on the address, at least one of the plurality of data units to output second data; and one or more multiplexers configured to receive the first data and the second data, and to output third data by replacing at least a portion of the first data with at least a portion of the second data.

The one or more multiplexers may output the third data based on one or more selection signals generated by the address selector.

BRIEF DESCRIPTION OF THE FIGURES

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 8 is a diagram schematically illustrating relation between addresses and data provided from an embedded memory device, according to at least one embodiment of the inventive concepts;

DETAILED DESCRIPTION

Figure 1:
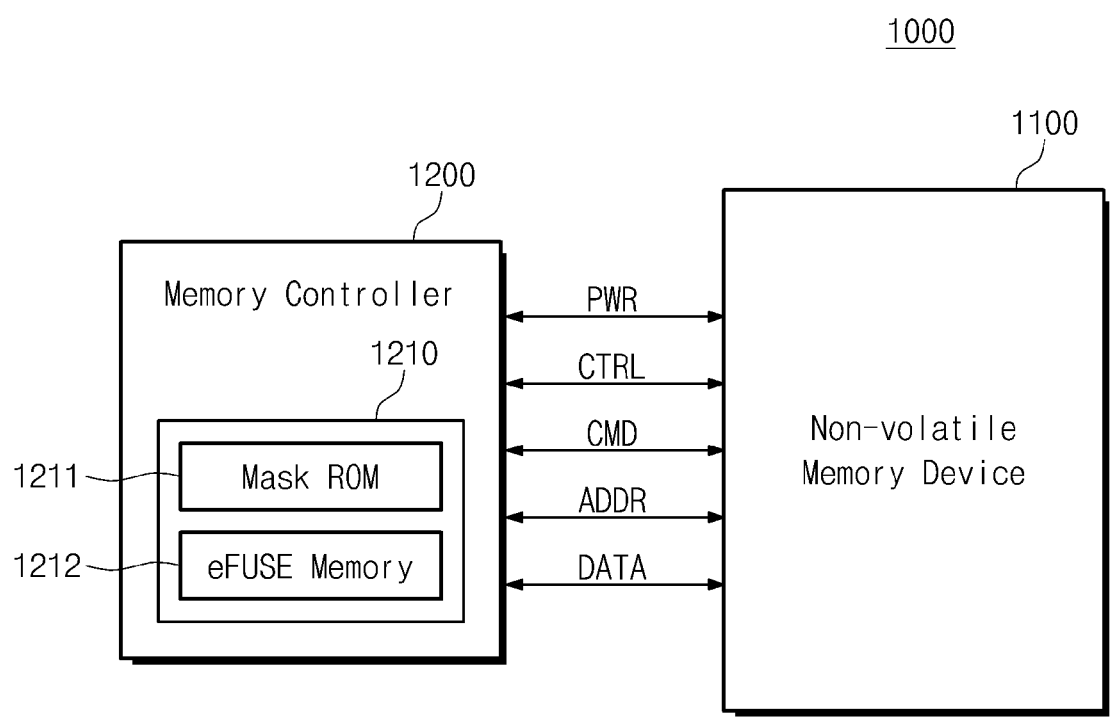
FIG. 1 is a block diagram schematically illustrating a nonvolatile memory system according to at least one embodiment of the inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a non-volatile memory system according to at least one embodiment of the inventive concepts. Referring to FIG. 1, a non-volatile memory system 1000 includes a non-volatile memory device 1100 and a memory controller 1200. The non-volatile memory system 1000 illustrated in FIG. 1 may comprise all data storage media based on non-volatile memories such as a solid state drive, a memory card, an USB memory, etc.

The non-volatile memory device 1100 may include one or more of a flash memory, an Electrically Erasable Programmable Read-Only Memory (EEPROM), a Ferroelectrics Random Access Memory (FRAM), a Phase change RAM (PRAM), a Magnetoresistive RAM (MRAM), etc. Referring to FIG. 1, the non-volatile memory device 1100 is used as a storage unit that stores data provided from the memory controller 1200. The non-volatile memory device 1100 is a NAND flash memory device, for example.

The non-volatile memory device 1100 performs an erase, write or read operation according to a control of the memory controller 1200. For this, the non-volatile memory device 1100 receives a command CMD, an address ADDR, and data through input/output lines. The non-volatile memory device 1100 receives a power PWR through a power line and a control signal CTRL through a control line.

The memory controller 1200 controls an overall operation of the non-volatile memory device 1100. The memory controller 1200 includes an embedded memory device 1210 that is used during booting. The embedded memory device 1210 includes a mask ROM 1211 and an e-fuse memory 1212.

The embedded memory device 1210 stores a booting code for booting, a firmware code, and various parameters for an operation of the memory controller 1200. Thus, the embedded memory device 1210 provides various codes and parameters to a microprocessor in the memory controller 1200.

The mask ROM 1211 is a memory device in which data is stored at a fabrication level, and programs are stored in the mask ROM 1211 when the mask ROM 1211 is fabricated. Thus, the mask ROM 1211 stores a booting code and a firmware code needed for booting of the microprocessor.

Since the degree of integration of the mask ROM 1211 is high, the mask ROM 1211 is cost-efficient. But, the mask ROM 1211 is disadvantageous in that it is impossible to revise an error of data or to update data stored therein. Thus, if data stored in the mask ROM 1211 is erroneous, a mask for the mask ROM 1211 is newly fabricated, and a development time, which may be, for example, longer than two months, is required to fabricate the mask ROM 1211 again. Consequently, productivity may be lowered.

When data stored in the mask ROM 1211 is failed or erroneous data, or an update on the data stored therein is required, the non-volatile memory system 1000 according to at least one embodiment of the inventive concepts replaces fail (or, erroneous) data of the mask ROM 1211 with data of the e-fuse memory 1212 without revising of the mask. Also, the non-volatile memory system 1000 according to at least one embodiment of the inventive concepts stores update data of the mask ROM 1211 in the e-fuse memory 1212. The e-fuse memory 1212 is used to replace fail data of the mask ROM 1211.

As will be more fully described below, a band width of the e-fuse memory 1212 is different from a band width of the mask ROM 1211. For example, a band width of the e-fuse memory 1212 is less than that of the mask ROM 1211. A band width of the mask ROM 1211 is decided at a fabrication level.

The e-fuse memory 1212 read different band widths of data according to an address. For example, a band width of the mask ROM 1211 is 64-bit, and a band width of the e-fuse memory 1212 is 32-bit, 16-bit or 8-bit according to an address. That is, the e-fuse memory 1212 may replace a part of data stored in the mask ROM 1211. Thus, the embedded memory 1210 selectively provides the memory controller 1200 with data of the mask ROM 1211 and data of the e-fuse memory 1212.

Figure 2:
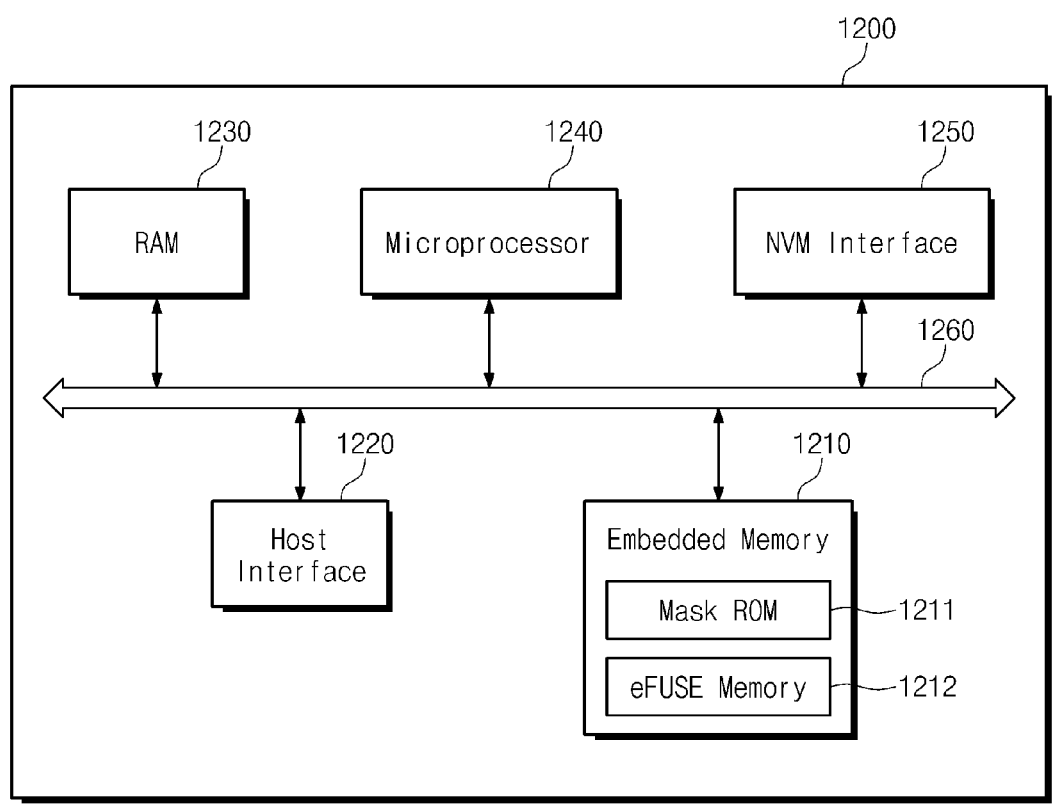
FIG. 2 is a block diagram schematically illustrating a memory controller illustrated in FIG. 1, according to at least one embodiment of the inventive concepts.

FIG. 2 is a block diagram schematically illustrating a memory controller illustrated in FIG. 1, according to at least one embodiment of the inventive concepts. Referring to FIG. 2, a memory controller 1200 includes an embedded memory device 1210, a host interface 1220, a RAM 1230, a microprocessor 1240, and a non-volatile memory interface 1250. The components 1210 to 1250 of the memory controller 1200 are electrically connected through a bus 1260.

The embedded memory device 1210 stores a firmware code or a booting code of a non-volatile memory system 1000. The embedded memory device 1210 includes a mask ROM 1211 and an e-fuse memory 1212. The embedded memory device 1210 receives an address from the microprocessor 1240. The mask ROM 1211 and the e-fuse memory 1212 reads data corresponding to the received address.

A firmware code or a booting code is stored in the mask ROM 1211 at a fabrication level. In the event that data stored in a mask ROM is erroneous, typically, it is difficult or impossible to easily revise the erroneous data. In this case, it is necessary to revise a mask and to again fabricate a mask ROM using the revised mask.

In the event that data stored in the mask ROM 1211 is failed or erroneous, the non-volatile memory system 1000 according to at least one embodiment of the inventive concepts replaces the fail (or, erroneous) data with fusing data of the e-fuse memory 1212 without fabricating of a new mask ROM. Thus, at least one example of the inventive concepts shortens a development time needed for mask revision and fabrication through data replacement and improves productivity of the embedded memory device 1210.

The firmware code may be stored in various non-volatile memory devices (e.g., a NAND flash memory device) in addition to the embedded memory device 1210. Thus, a control or intervention of the microprocessor 1240 includes a direct control of the microprocessor 1240 in hardware and an interference of firmware, driven by the microprocessor 1240, in software. The embedded memory device 1210 will be more fully described with reference to FIGS. 3 and 4.

The host interface 1220 performs an interface between a memory system 1000 and a host according to a predetermined protocol. The memory system 1000 includes the memory controller 1200. The host interface 1220 communicates with an external host through USB (Universal Serial Bus), SCSI (Small Computer System Interface), PCI express, ATA, PATA (Parallel ATA), SATA (Serial ATA), SAS (Serial Attached SCSI), etc.

The RAM 1230 is a memory acting as a buffer. The RAM 1230 stores an initial command received through host I/O, data, data output from the embedded memory device 1210 and the non-volatile memory device 1100, or various parameters.

The microprocessor 1240 is implemented by circuit, logic, code, or combination thereof. The microprocessor 1240 controls an overall operation of the memory system 1000 including the memory controller 1200. If a power is applied to the embedded memory device 1210, the microprocessor 1240 controls an overall operation of the non-volatile memory system 1000 by driving firmware or a booting code needed for an operation of the non-volatile memory system 1000 and stored in the embedded memory device 1210 on the RAM 1230.

The microprocessor 1240 interprets a command provided from a host and controls an overall operation of the non-volatile memory device 1100 according to the interpretation result. The microprocessor 1240 receives an address from the host to provide it to the embedded memory device 1210.

The non-volatile memory interface 1250 performs an interface between the memory controller 1200 and the non-volatile memory device 1100. As illustrated in FIG. 2, a command controlled by the microprocessor 1240 is provided to the non-volatile memory device 1100 through the non-volatile memory interface 1250. Data is transferred from the memory controller 1200 to the non-volatile memory device 1100 through the non-volatile memory interface 1250. Data output from the non-volatile memory device 1100 is provided to the memory controller 1200 through the non-volatile memory interface 1250.

Figure 3:
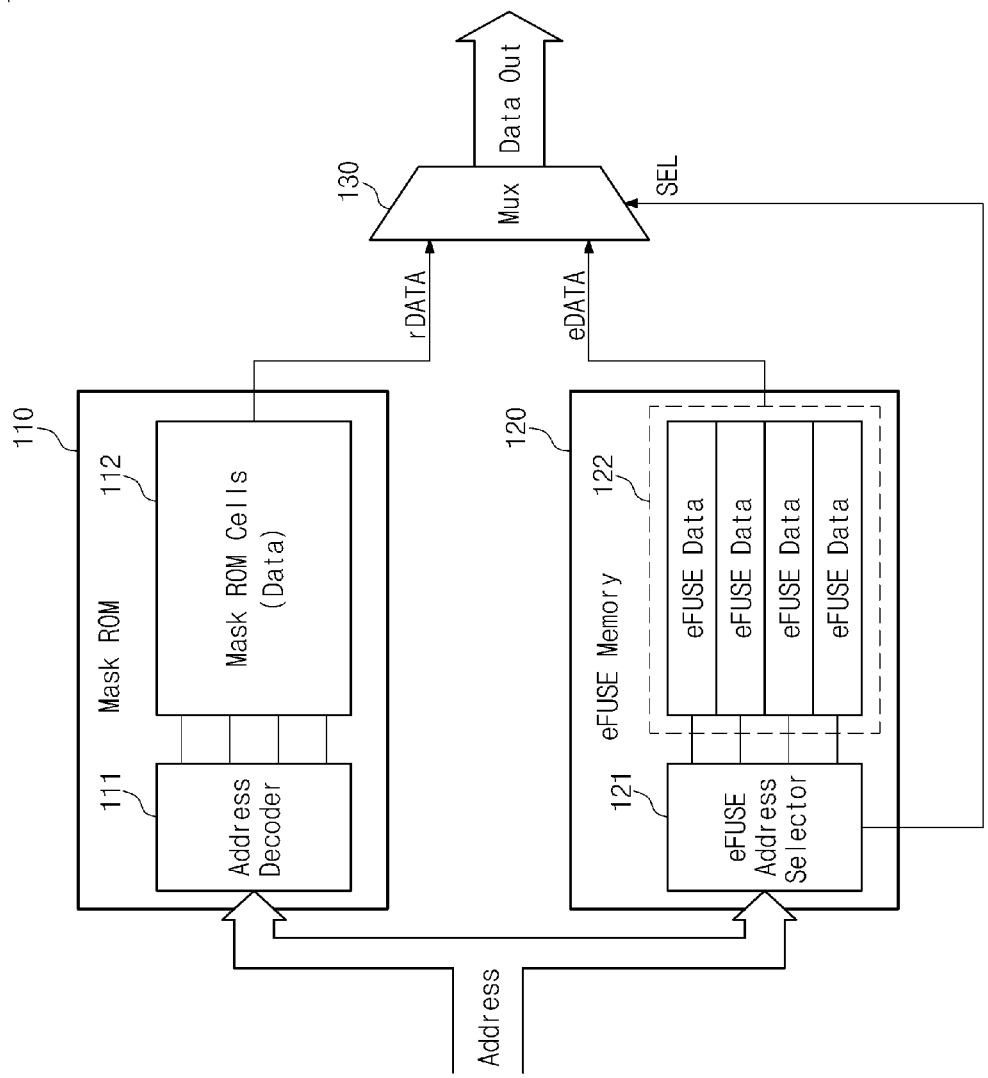
FIG. 3 is a block diagram schematically illustrating an embedded memory device illustrated in FIG. 2, according to at least one embodiment of the inventive concepts.

FIG. 3 is a block diagram schematically illustrating an embedded memory device illustrated in FIG. 2, according to at least one embodiment of the inventive concepts. Referring to FIG. 3, an embedded memory device 1210A includes a mask ROM 110, an e-fuse memory 120, and multiplexer 130. The embedded memory device 1210A receives an address. The address is provided to the mask ROM 110 and the e-fuse memory 120.

The mask ROM 110 includes an address decoder 111 and mask ROM cells 112. The address decoder 111 decodes the input address such that data of the mask ROM cells 112 corresponding to the input address is read. Data rDATA read from the mask ROM 110 is provided to the multiplexer 130.

The e-fuse memory 120 includes an e-fuse address selector 121 and e-fuse data cells 122. The e-fuse address selector 121 selects and reads e-fuse data cells 122 corresponding to the input address. Data eDATA read from the e-fuse memory 120 is provided to the multiplexer 130.

A band width of the e-fuse memory 120 is equal to or less than that of the mask ROM 110. The multiplexer 130 selects either one of data rDATA provided from the mask ROM 110 and data eDATA provided from the e-fuse memory 120 and provides the selected data to a memory controller 1200 (refer to FIG. 1).

The e-fuse address selector 121 may control a plurality of multiplexers. The e-fuse address selector 121 provides a selection signal SEL to the multiplexer 130. In response to selection of the e-fuse address selector 121, the multiplexer 130 selects either one of data rDATA provided from the mask ROM 110 and data eDATA provided from the e-fuse memory 120 and provides the selected data to the outside of the embedded memory device 1210A.

Figure 4:
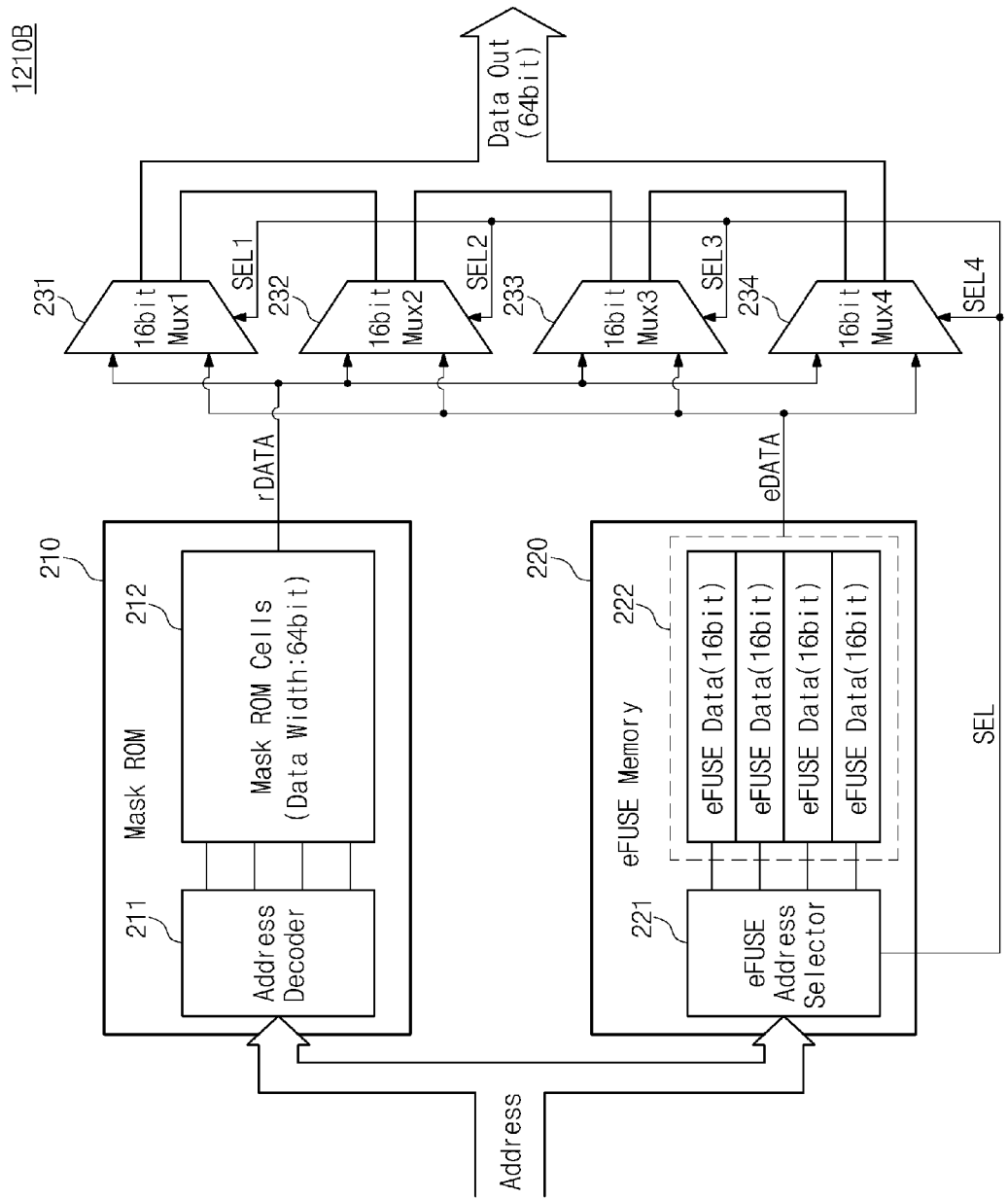
FIG. 4 is a block diagram schematically illustrating an embedded memory device illustrated in FIG. 2, according to at least one embodiment of the inventive concepts.

FIG. 4 is a block diagram schematically illustrating an embedded memory device illustrated in FIG. 2, according to at least one embodiment of the inventive concepts. Referring to FIG. 4, an embedded memory device 1210B includes a mask ROM 210, an e-fuse memory 220 and first to fourth multiplexers 231 to 234.

A band width of the mask ROM 210 may be chosen at a fabrication level. In FIG. 4, for example, a band width of 64-bits is chosen as the band width of the mask ROM 210. A band width means the number of data bits corresponding to a particular address. As described with reference to FIG. 2, the mask ROM 210 is problematic in that data stored in the mask ROM 210 is revised by using a revising a mask and again fabricating the mask ROM 210 using the revised mask.

Referring to FIG. 4, the mask ROM 210 includes an address decoder 211 and mask ROM cells 212 to store data. In the event that a part of 64 data bits in the mask ROM 210 is failed or erroneous, the failed or erroneous data of the mask ROM 210 is replaced with data stored in the e-fuse memory 220. Data rDATA read from the mask ROM 210 is distributed to the first to fourth multiplexers 231 to 234. For example, 64-bit data read from the mask ROM 210 is divided by a unit of 16 bits to be provided to each of the first to fourth multiplexers 231 to 234, respectively.

The e-fuse memory 220 includes an e-fuse address selector 221 and e-fuse data cells 222. The e-fuse address selector 221 selects and read e-fuse data cells 222 corresponding to an input address. Referring to FIG. 4, a band width of the e-fuse memory 220 is 16-bit, for example. According to at least one example embodiment, a band width of the e-fuse memory 220 is less than that of the mask ROM 210.

Data eDATA read from the e-fuse memory 220 is provided to the first to fourth multiplexers 231 to 234. The first to fourth multiplexers 231 to 234 receive data from the mask ROM 210 and the e-fuse memory 220 and selectively provide the received data to a memory controller 1200 (refer to FIG. 1).

The e-fuse address selector 221 controls the first to fourth multiplexers 231 to 234. That is, the e-fuse address selector 221 provides the first to fourth multiplexers 231 to 234 with first to fourth selection signals SEL1 to SEL4, respectively. According to a control of the e-fuse address selector 221, each of the first to fourth multiplexers 231 to 234 selects data eDATA read from the e-fuse memory 220 or data rDATA read from the mask ROM 210 and provides the selected data to the outside of the embedded memory device 1210B.

Thus, the embedded memory device 1210B provides the memory controller 1200 with data bits whose number corresponds to a band width of the mask ROM 210. For example, the first multiplexer 231 selects 16-bit data provided from the mask ROM 210 and the second multiplexer 232 selects 16-bit data provided from the e-fuse memory 220. Likewise, each of the third and fourth multiplexers 233 and 234 selects 16-bit data provided from the mask ROM 210. The embedded memory device 1210B provides the memory controller 1200 with 64-bit data that does not include a fail bit, through the above-described operation.

Figure 5:
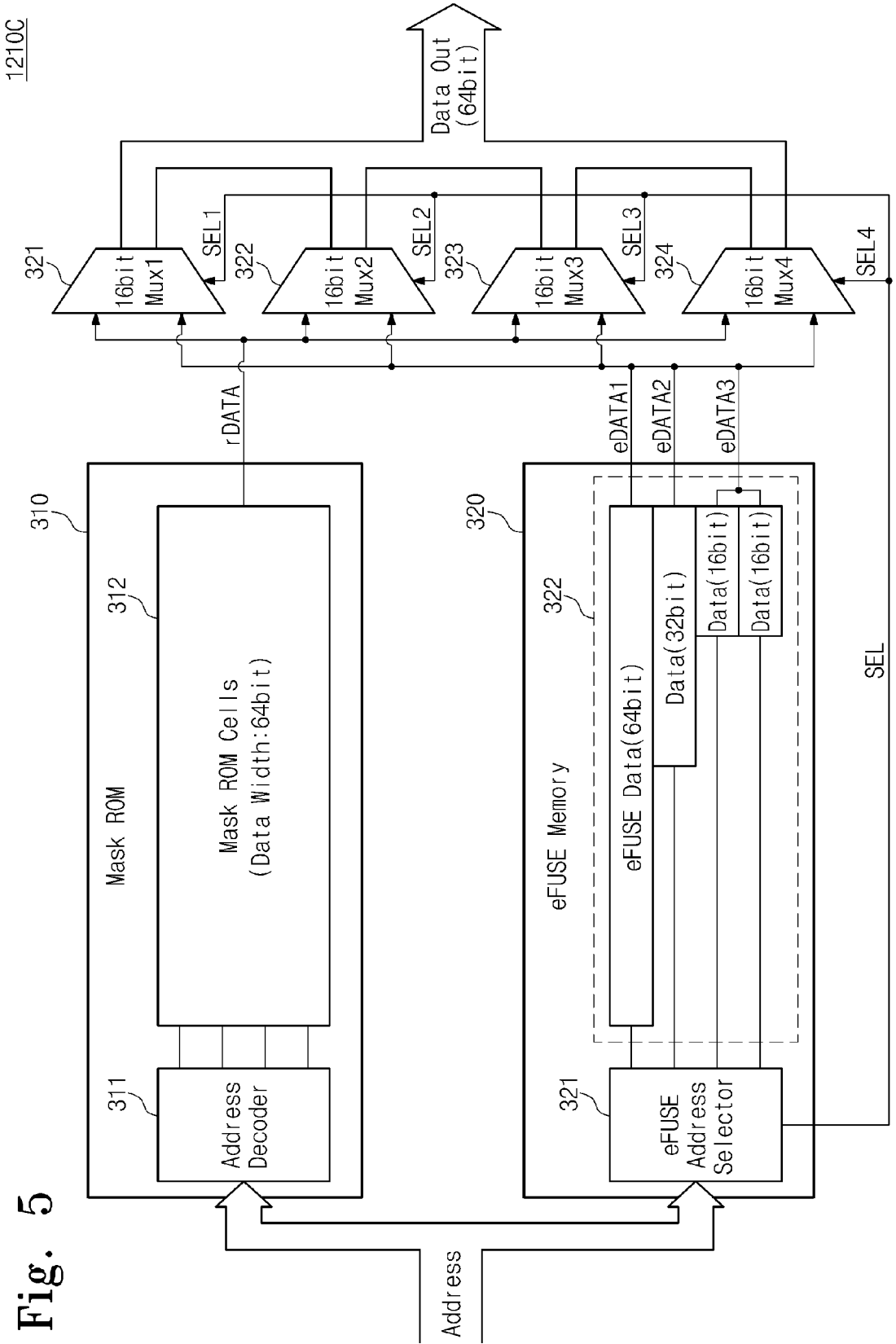
FIG. 5 is a block diagram schematically illustrating an embedded memory device illustrated in FIG. 2, according to at least one embodiment of the inventive concepts.

FIG. 5 is a block diagram schematically illustrating an embedded memory device illustrated in FIG. 2, according to at least one embodiment of the inventive concepts. Referring to FIG. 5, an embedded memory device 1210C includes a mask ROM 310, an e-fuse memory 320 and first to fourth multiplexers 321 to 324. In the event that a part or all of 64-bit data of the mask ROM 310 is failed or erroneous, the failed or erroneous data of the mask ROM 310 is replaced with data stored in the e-fuse memory 320.

Referring to FIG. 5, data rDATA read from the mask ROM 310 is distributed to the first to fourth multiplexers 321 to 324. The e-fuse memory 320 includes an e-fuse address selector 321 and e-fuse data cells 322. The e-fuse address selector 321 selects and reads e-fuse data cells corresponding to an input address.

A band width of the e-fuse memory 320 is variable according to an input address. For example, a band width corresponding to a particular address of the e-fuse memory 320 includes 64-bit, 32-bit, and 16-bit. A band width of the e-fuse memory 320 is equal to or less than that of the mask ROM 310.

Data eDATA1, eDATA2, and eDATA3 read from the e-fuse memory 320 are provided to the first to fourth multiplexers 321 to 324. Each of the first to fourth multiplexers 321 to 324 selects at least one of data provided from the mask ROM 310 and data provided from the e-fuse memory 320 and provides the selected data to a memory controller 1200.

The e-fuse address selector 321 controls the first to fourth multiplexers 321 to 324. The e-fuse address selector 321 provides the first to fourth multiplexers 321 to 324 with first to fourth selection signals SEL1 to SEL4, respectively. according to a control of the e-fuse address selector 321, the first to fourth multiplexers 321 to 324 select data eDATA1, eDATA2, and eDATA3 read from the e-fuse memory 320 or data rDATA read from the mask ROM 310 and provide the selected data to the outside of the embedded memory device 1210C.

Figure 6:
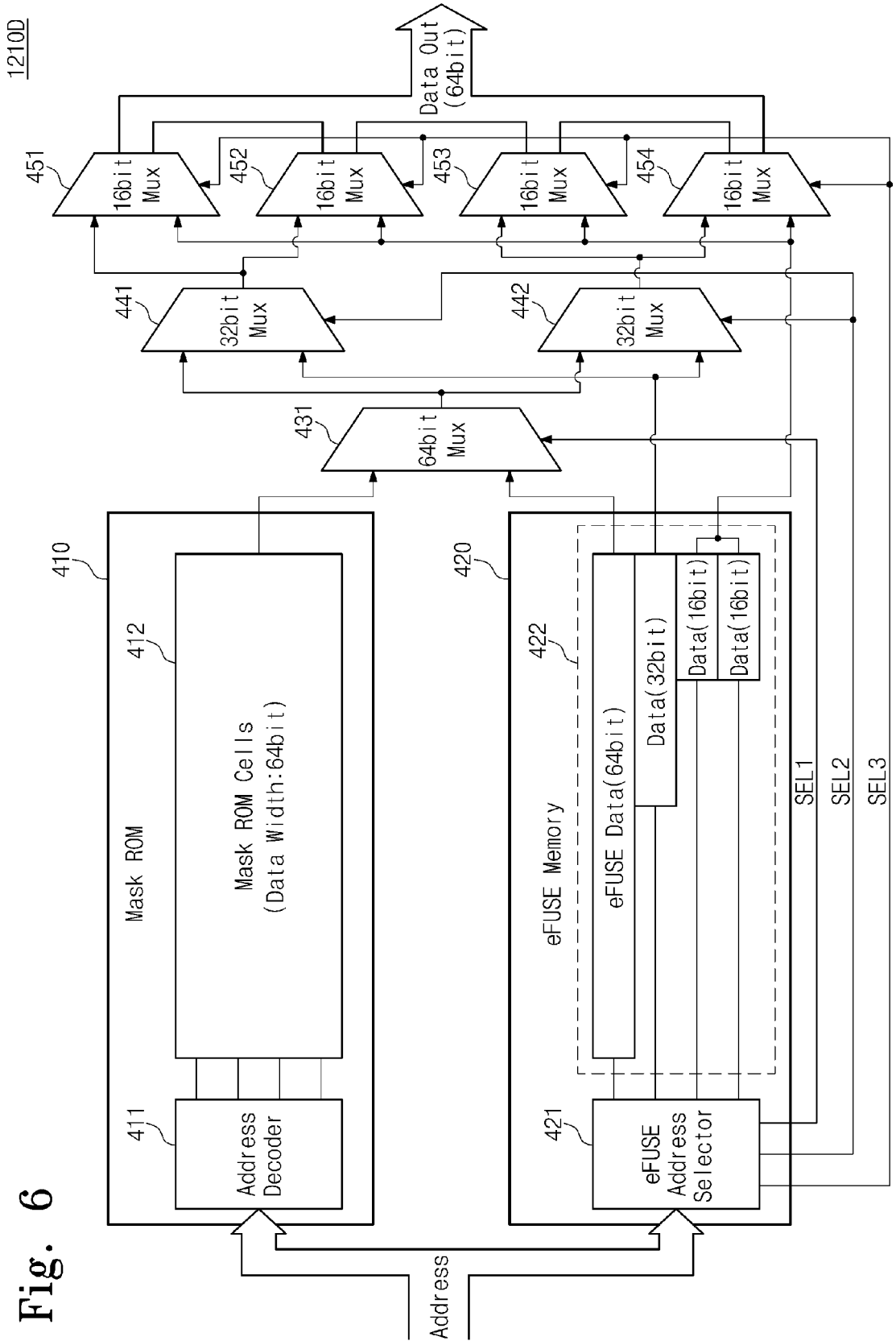
FIG. 6 is a block diagram schematically illustrating an embedded memory device illustrated in FIG. 2, according to at least one embodiment of the inventive concepts.

FIG. 6 is a block diagram schematically illustrating an embedded memory device illustrated in FIG. 2, according to at least one embodiment of the inventive concepts. Referring to FIG. 6, an embedded memory device 1210D includes a mask ROM 410, an e-fuse memory 420 and first to seventh multiplexers 431, 441, 442, 451, 452, 453, and 454.

Referring to FIG. 6, the mask ROM 410 includes an address decoder 411 and mask ROM cells 412. In the event that a part or all of 64-bit data of the mask ROM 410 is failed or erroneous, the failed or erroneous data of the mask ROM 410 is replaced with data stored in the e-fuse memory 420.

Data read from the mask ROM 410 is provided to the first multiplexer 431. 64-bit data read from the mask ROM 410 is distributed to the first to seventh multiplexers 431 to 454. Here, the first multiplexer 431 is a 64-bit multiplexer, the second and third multiplexers 441 and 442 are 32-bit multiplexers, and the fourth to seventh multiplexers 451 to 454 are 16-bit multiplexers.

The e-fuse memory 420 includes an e-fuse address selector 421 and a plurality of e-fuse data cells 422. The e-fuse address selector 421 selects and reads e-fuse data cells 422 corresponding to an input address. The e-fuse memory 420 has a 64-bit band width, a 32-bit band width, and a 16-bit band width, for example. A band width of the e-fuse memory 420 is equal to or less than that of the mask ROM 410.

Data read from the e-fuse memory 420 is distributed to the first to seventh multiplexers 431 to 454. The first to seventh multiplexers 431 to 454 select at least one of data provided from the mask ROM 410 and data provided from the e-fuse memory 420 and provide the selected data to a memory controller 1200 (refer to FIG. 1).

The e-fuse address selector 421 controls the first to seventh multiplexers 431 to 454. The e-fuse address selector 421 provides the first to seventh multiplexers 431 to 454 with first to third selection signals SEL1 to SEL3. The first selection signal SEL1 is provided to the 64-bit multiplexer 431, the second selection signal SEL2 is provided to the 32-bit multiplexers 441 and 442, and the third selection signal SEL3 is provided to the 16-bit multiplexers 451 to 454. According to at least one example embodiment, the second selection signal SEL2 may include plural signals, for example two signals, such that the 32-bit multiplexers 441 and 442 may be controlled independently. According to at least one example embodiment, the third selection signal SEL3 may include plural signals, for example 4 signals, such that the 16-bit multiplexers 451 to 454 may be controlled independently. Consequently, portions of the 64-bit Mask ROM data 412 may be selectively replaced with differing amounts of data from the eFUSE memory 420.

For example, the first multiplexer 431 receives 64-bit data from the mask ROM 410. The first multiplexer 431 distributes the 64-bit data to the second and third multiplexers 441 and 442 by a unit of 32 bits. The second and third multiplexers 441 and 442 divides the 32-bit data into 16-bit data groups according to a control of the e-fuse address selector 421 and provide the 16-bit data groups to the fourth to seventh multiplexers 451 to 454, respectively.

According to a control of the e-fuse address selector 421, the first to seventh multiplexers 431 to 454 select data read from the e-fuse memory 420 or data read from the mask ROM 410 and provide the selected data to the outside of the embedded memory device 1210D. The embedded memory device 1210D provides the memory controller 1200 with data bits whose number corresponds to a band width of the mask ROM 410.

The e-fuse memory 420 selects data of the e-fuse memory 420 according to an input address. For example, in the event that the e-fuse memory 420 selects 64-bit data based on an address, the e-fuse memory 420 provides 64-bit data to the first multiplexer 431. The e-fuse address selector 421 controls the first multiplexer 431 to select data of the e-fuse memory 420 of data of the mask ROM 410 and data of the e-fuse memory 420. The selected data of the e-fuse memory 420 is provided to the outside of the embedded memory device 1210D.

Figure 7:
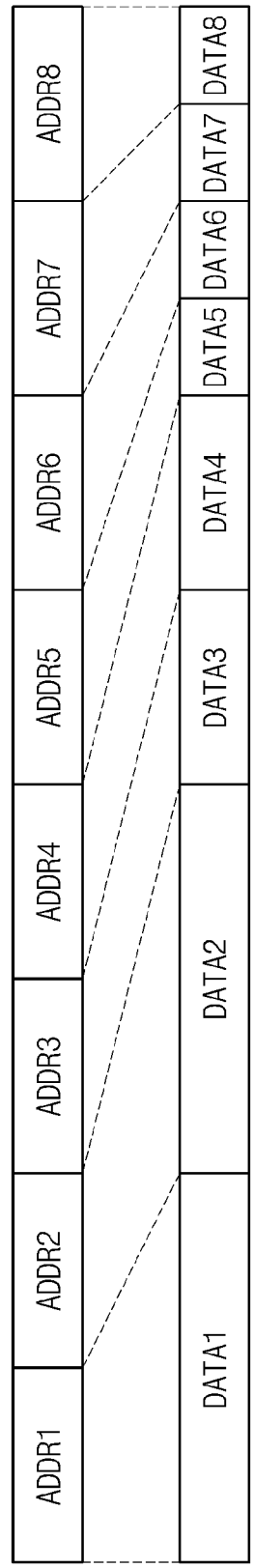
FIG. 7 is a diagram schematically illustrating relation between addresses and data provided from an embedded memory device, according to at least one embodiment of the inventive concepts.

FIG. 7 is a diagram schematically illustrating relation between addresses and data provided from an embedded memory device, according to at least one embodiment of the inventive concepts. Referring to FIG. 7, an e-fuse memory stores data having a band width that is variable according to an input address as described with reference to FIGS. 5 and 6. First to eighth addresses ADDR1 to ADDR8 correspond to first to eighth data DATA1 to DATA8, respectively. The first to eighth data DATA1 to DATA8 may include at least two different band widths.

FIG. 8 is a diagram schematically illustrating relation between addresses and data provided from an embedded memory device, according to at least one embodiment of the inventive concepts. Referring to FIG. 8, an e-fuse memory may store data having the same band width according to an input address as being explained in FIG. 4. In FIG. 8, there is illustrated a 1:1 correspondence between addresses and data. As illustrated in FIG. 8, first to fourth addresses ADDR1 to ADDR4 correspond to first to fourth data DATA1 to DATA4, respectively. The first to fourth data DATA1 to DATA4 have the same band width.

Figure 9:
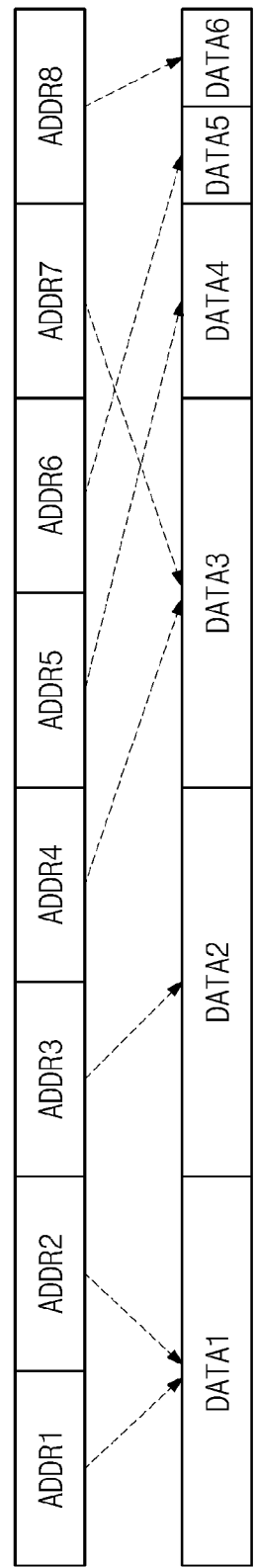
FIG. 9 is a diagram schematically illustrating relation between addresses and data provided from an embedded memory device, according to at least one embodiment of the inventive concepts.

FIG. 9 is a diagram schematically illustrating relation between addresses and data provided from an embedded memory device, according to at least one embodiment of the inventive concepts. Referring to FIG. 9, data and addresses provided to an embedded memory device have a 1:n correspondence (n being an integer of 2 or more). For example, particular data corresponds to a plurality of addresses. Also, band widths corresponding to addresses are different from one another.

Referring to FIG. 9, first and second addresses ADDR1 and ADDR2 correspond to first data DATA1, a third address ADDR3 corresponds to second data DATA2, and fourth and seventh addresses ADDR4 and ADDR7 correspond to third data DATA3. A fifth address ADDR5 corresponds to fourth data DATA4, a sixth address ADDR6 corresponds to fifth data DATA5, and an eighth address ADDR8 corresponds to sixth data DATA6. Band widths of the first to sixth data DATA1 to DATA6 are different from one another.

Figure 10:
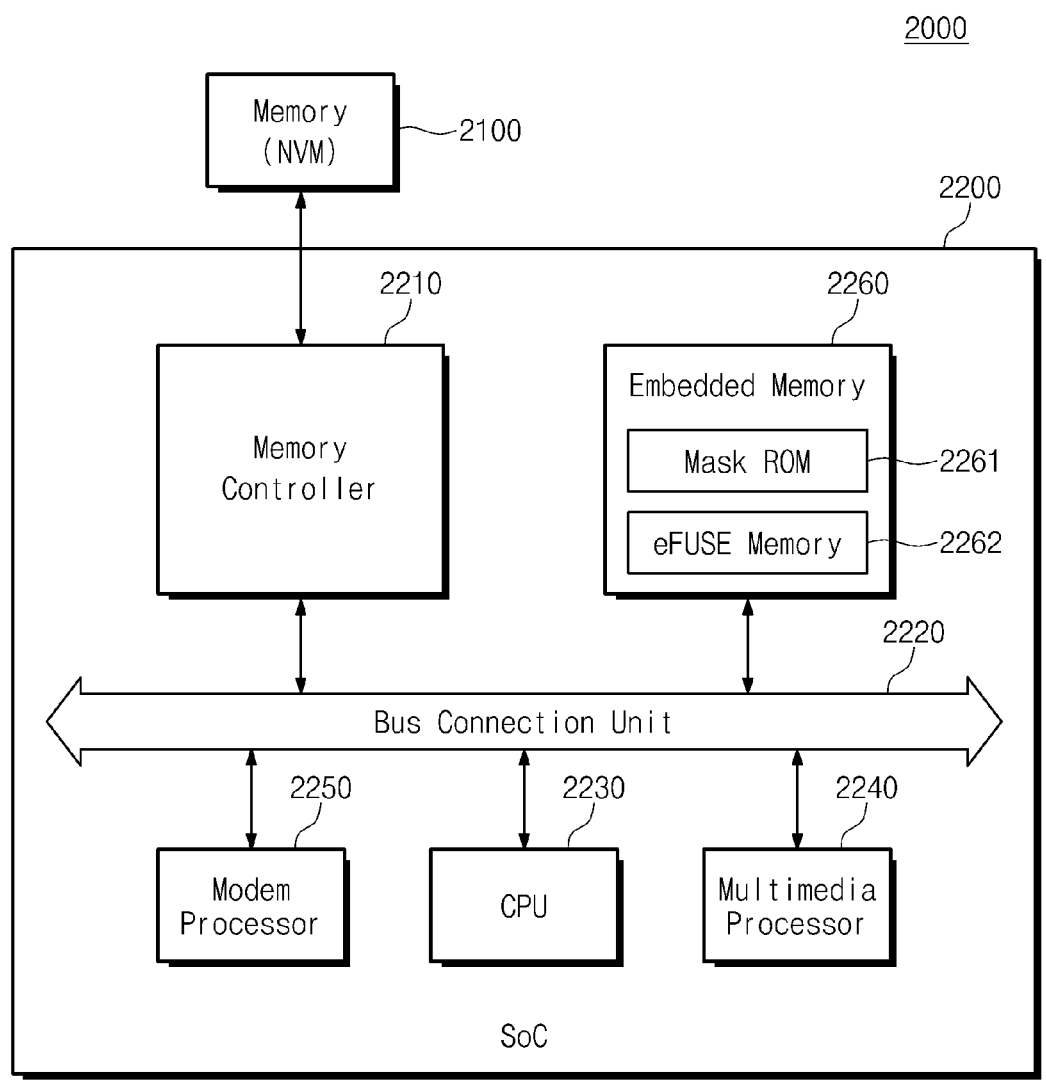
FIG. 10 is a block diagram schematically illustrating a memory system including an embedded memory device according to at least one embodiment of the inventive concepts.

FIG. 10 is a block diagram schematically illustrating a memory system including an embedded memory device according to at least one embodiment of the inventive concepts. Referring to FIG. 10, a memory system 2000 includes an application processor 2200 that is implemented on a system on chip (SoC).

The application processor 2200 includes a memory controller 2210 for controlling a memory, a bus connection unit 2220, a Central Processing Unit (CPU) 2230, a multimedia processor 2240, a modem processor 2250, and an embedded memory device 2260. The memory controller 2210 accesses a memory 2100. The CPU 2230 controls an overall operation of the application processor 2200 and controls peripheral devices such as the memory 2100, etc.

The multimedia processor 2240 controls multimedia devices such as a camera, a display, etc. The modem processor 2250 implemented on the system on chip is a processor that perform wireless communication with a base station or other communication devices. The modem processor 2250 accesses the memory 2100 through sharing with the application processor 2200. According to at least one embodiment of the inventive concepts, the embedded memory device 2260 may be implemented so as to be separated from the memory controller 2210. The embedded memory device 2260 may have the same structure and operation as that discussed above with respect to any of the embedded memories in FIGS. 1-9.

Figure 11:
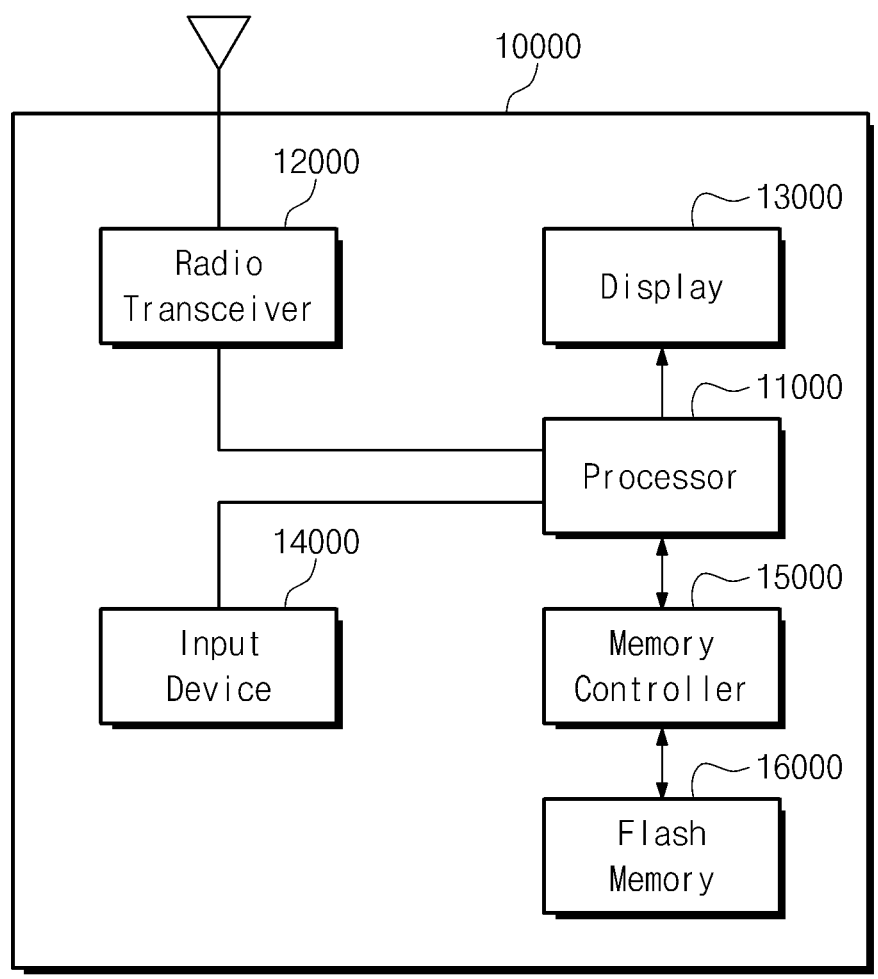
FIG. 11 is a block diagram schematically illustrating an electronic device including a memory controller and a non-volatile memory device, according to at least one embodiment of the inventive concepts.

FIG. 11 is a block diagram schematically illustrating an electronic device including a memory controller and a non-volatile memory device, according to at least one embodiment of the inventive concepts. An embedded memory device according to at least one embodiment of the inventive concepts may be installed within a memory controller 15000.

Referring to FIG. 11, an electronic device 10000 such as a cellular phone, a smart phone, or a tablet PC may include a non-volatile memory device 16000 implemented by a flash memory device and a memory controller 15000 to control the non-volatile memory device 16000.

The non-volatile memory device 16000 means a non-volatile memory device illustrated in FIG. 1. The non-volatile memory device 16000 stores random data. The memory controller 15000 is controlled by a processor 11000 that controls an overall operation of the electronic device 10000. Data stored at the non-volatile memory device 16000 is displayed through a display 13000 according to a control of the memory controller 15000 that operates according to a control of the processor 11000. According to at least one example embodiment, the memory controller 15000 may include an embedded memory device that has the same structure and operation as that discussed above with respect to any of the embedded memories in FIGS. 1-9.

A radio transceiver 12000 exchanges a radio signal through an antenna. For example, the radio transceiver 12000 converts a radio signal received through the antenna into a signal capable of being processed by the processor 11000. Thus, the processor 11000 processes a signal from the radio transceiver 12000, and stores the processed signal in the non-volatile memory device 16000. Or, the processor 11000 displays the processed signal through the display 13000.

The radio transceiver 12000 converts a signal from the processor 11000 into a radio signal, and outputs the converted radio signal to the exterior through the antenna. An input device 14000 is a device that receives a control signal for controlling an operation of the processor 11000 or data to be processed by the processor 11000, and is implemented by a pointing device such as a touch pad or a computer mouse, a key pad, or a keyboard.

The processor 11000 controls the display 13000 such that data from the non-volatile memory device 16000, a radio signal from the radio transceiver 12000 or data from the input device 14000 is displayed through the display 13000.

Figure 12:
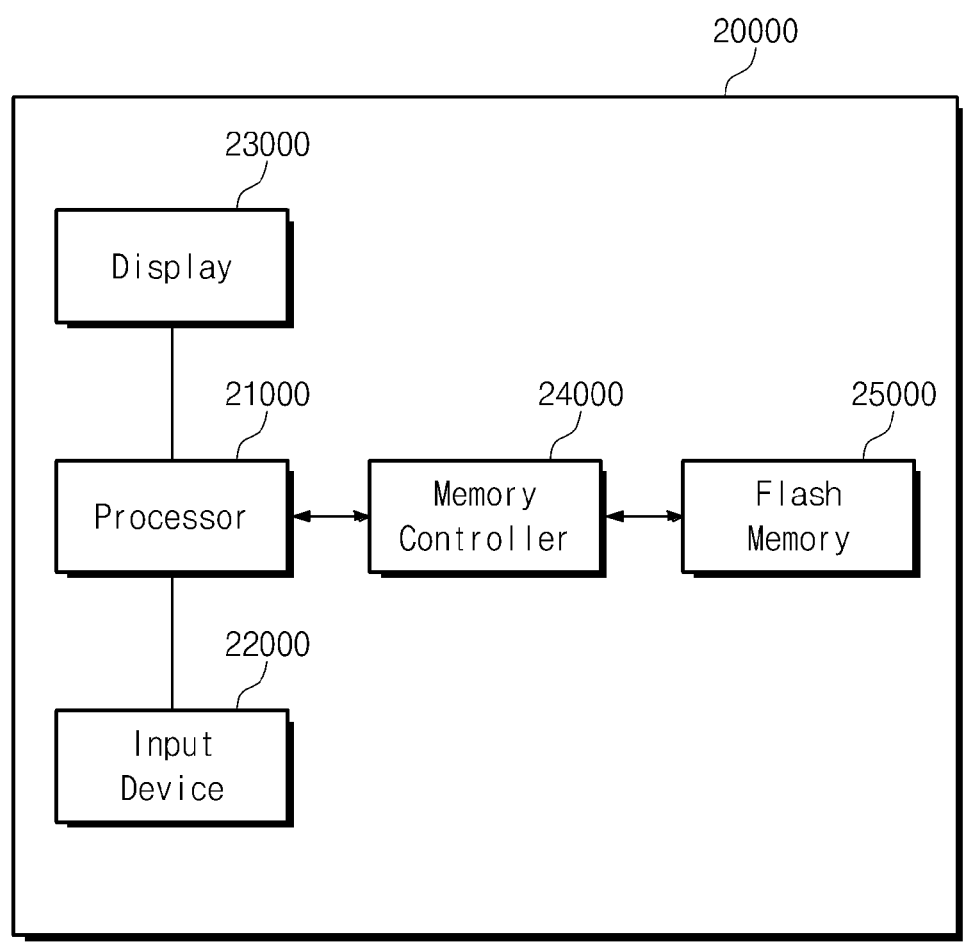
FIG. 12 is a block diagram schematically illustrating an electronic device including a memory controller and a non-volatile memory device, according to at least one embodiment of the inventive concepts.

FIG. 12 is a block diagram schematically illustrating an electronic device including a memory controller and a non-volatile memory device, according to at least one embodiment of the inventive concepts.

Referring to FIG. 12, an electronic device 20000 may be implemented by a data processing device such as a personal computer, a tablet computer, a net-book, an e-reader, a PDA (Personal Digital Assistant), a PMP (Portable Multimedia Player), an MP3 player, or an MP4 player, and includes a non-volatile memory device 25000 (e.g., a flash memory device) and a memory controller 24000 to control an operation of the non-volatile memory device 25000.

The non-volatile memory device 25000 means a non-volatile memory device illustrated in FIG. 1. The non-volatile memory device 25000 stores random data. The electronic device 20000 includes a processor 21000 to control an overall operation of the electronic device 20000. A memory controller 24000 is controlled by the processor 21000. According to at least one example embodiment, the memory controller 24000 may include an embedded memory device that has the same structure and operation as that discussed above with respect to any of the embedded memories in FIGS. 1-9.

The processor 21000 displays data stored at the non-volatile memory device 25000 through a display 23000 according to an input signal generated by an input device 22000. For example, the input device 22000 is implemented by a pointing device such as a touch pad or a computer mouse, a key pad, or a keyboard.

Figure 13:
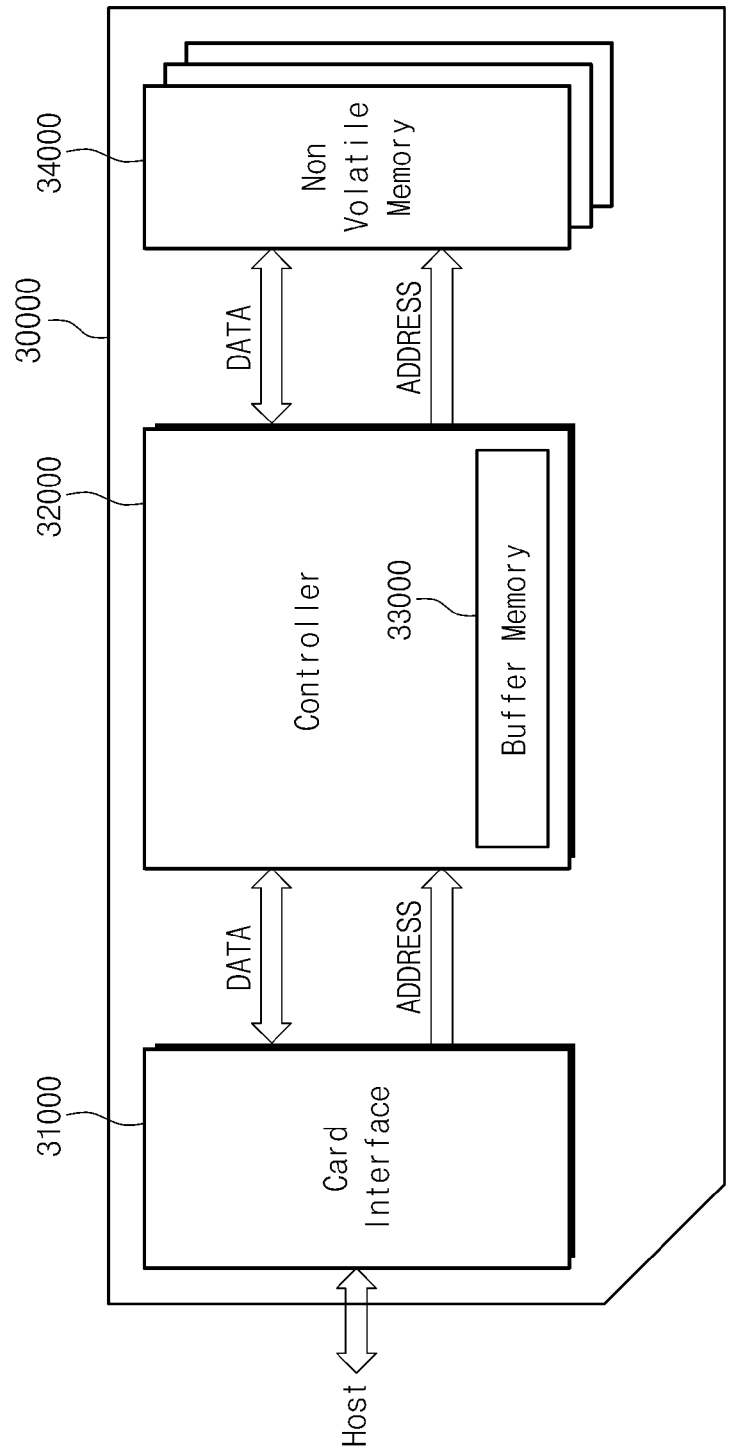
FIG. 13 is a block diagram schematically illustrating an electronic device including a non-volatile memory device, according to at least one embodiment of the inventive concepts.

FIG. 13 is a block diagram schematically illustrating an electronic device including a non-volatile memory device, according to at least one embodiment of the inventive concepts. An embedded memory device according to at least one embodiment of the inventive concepts may be installed within a memory controller 32000 of an electronic device. The embedded memory device may have the same structure and operation as that discussed above with respect to any of the embedded memories in FIGS. 1-9.

Referring to FIG. 13, an electronic device 30000 includes a card interface 31000, a memory controller 32000, and a non-volatile memory device 34000 (e.g., a flash memory device). The electronic device 30000 exchanges data with a host through the card interface 31000. The card interface 31000 may be an SD (Secure Digital) card interface or an MMC (Multi-Media Card) interface. However, according to at least one example embodiment of the inventive concepts, different interface may be used. The card interface 31000 interfaces data exchange between the host and the memory controller 32000 according to the communications protocol of the host capable of communicating the electronic device 30000.

The memory controller 32000 controls an overall operation of the electronic device 30000, and control data exchange between the card interface 31000 and the non-volatile memory device 34000. A buffer memory 33000 of the memory controller 32000 buffers data transferred between the card interface 31000 and the non-volatile memory device 34000.

The memory controller 32000 is connected to the card interface 31000 and the non-volatile memory device 34000 through a data bus DATA and an address bus ADDRESS. According to at least one embodiment of the inventive concepts, the memory controller 32000 receives an address of data to be read or written from the card interface 31000 through the address bus ADDRESS to send it to the non-volatile memory device 34000.

Also, the memory controller 32000 receives or transfers data to be read or written through the data bus DATA connected to the card interface 31000 or the non-volatile memory device 34000. The non-volatile memory device 34000 means a non-volatile memory device illustrated in FIG. 1. The non-volatile memory device 34000 stores random data.

When the electronic device 30000 is connected to a host such as a PC, a tablet PC, a digital camera, a digital audio player, a mobile phone, console video game hardware or a digital set-top box, the host may exchange data stored in the non-volatile memory device 34000 through the card interface 31000 and the memory controller 32000.

Figure 14:
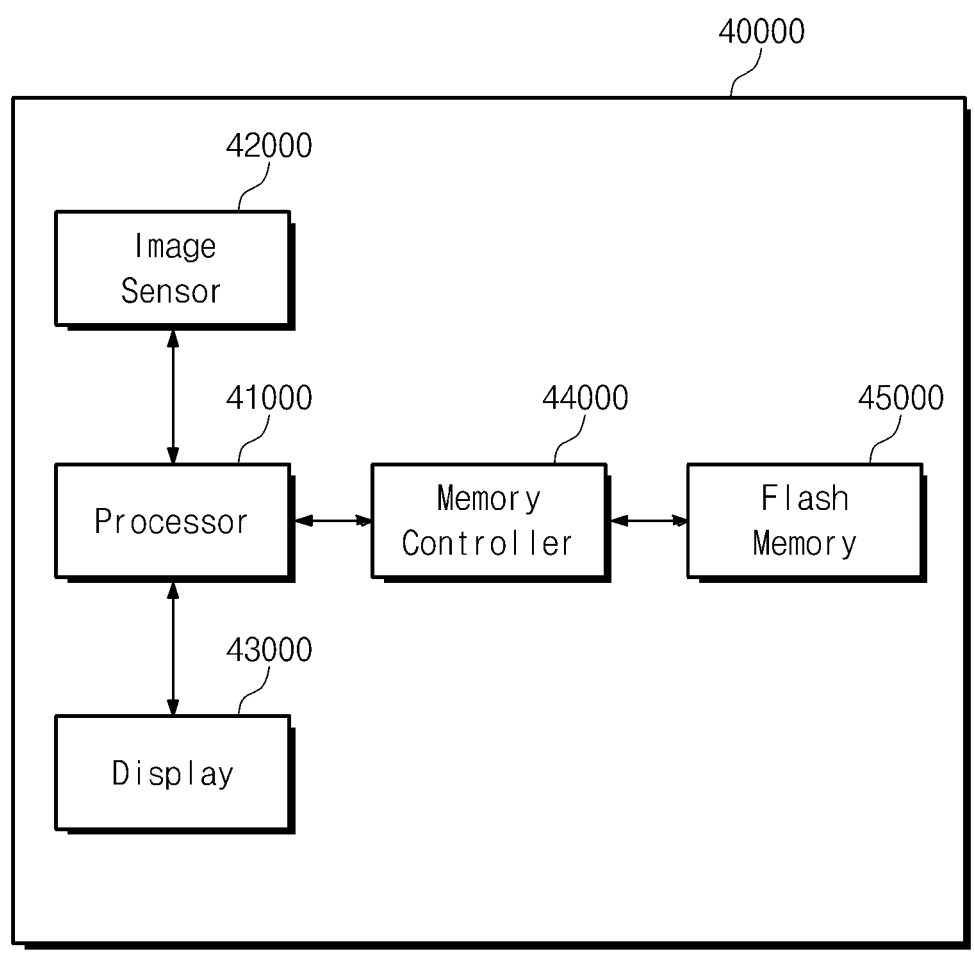
FIG. 14 is a block diagram schematically illustrating an electronic device including a memory controller and a non-volatile memory device, according to at least one embodiment of the inventive concepts.

FIG. 14 is a block diagram schematically illustrating an electronic device including a memory controller and a non-volatile memory device, according to at least on embodiment of the inventive concepts.

Referring to FIG. 14, an electronic device 40000 includes a non-volatile memory device 45000 (e.g., a flash memory device), a memory controller 44000 to control a data processing operation of the non-volatile memory device 45000, and a processor 41000 to control an overall operation of the electronic device 40000. The non-volatile memory device 45000 means a non-volatile memory device illustrated in FIG. 1. According to at least one example embodiment, the memory controller 44000 may include an embedded memory device that has the same structure and operation as that discussed above with respect to any of the embedded memories in FIGS. 1-9.

An image sensor 42000 of the electronic device 40000 converts an optical signal into a digital signal, and the converted digital signal is stored in the non-volatile memory device 45000 under a control of the processor 41000. Or, the converted digital signal is displayed through a display 43000 under a control of the processor 41000.

Figure 15:
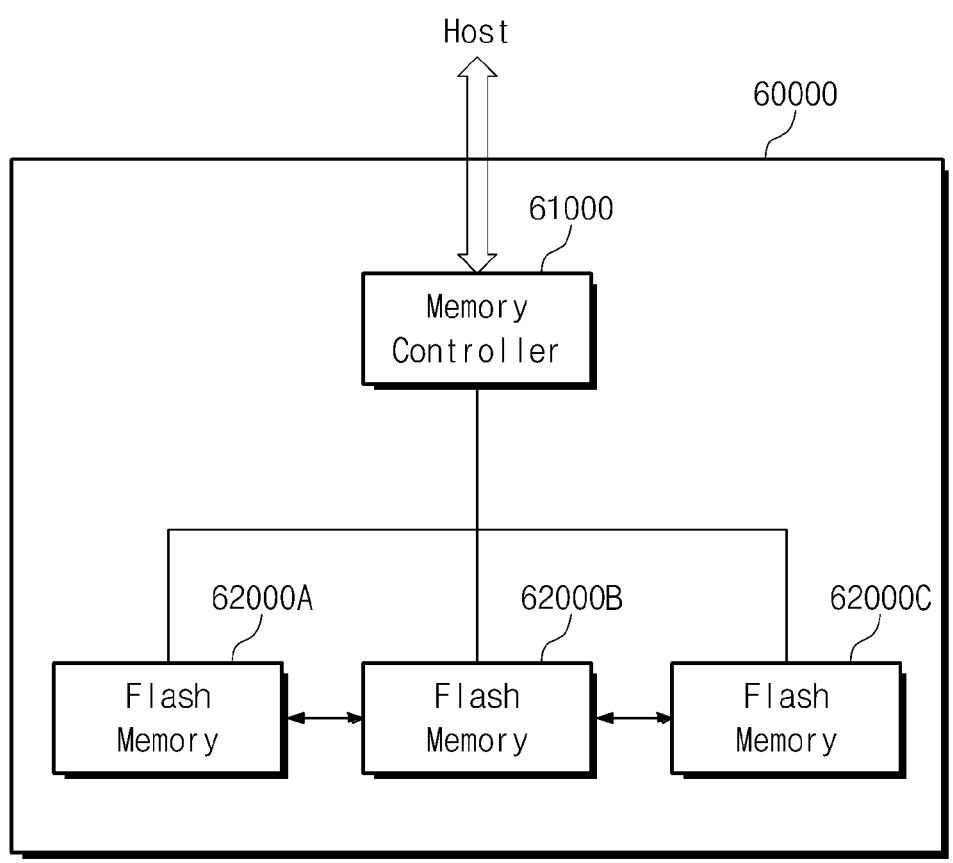
FIG. 15 is a block diagram schematically illustrating an electronic device 60000 including a memory controller 61000 and non-volatile memory devices 62000A, 62000B, and 62000C, according to at least one embodiment of the inventive concepts.

FIG. 15 is a block diagram schematically illustrating an electronic device 60000 including a memory controller 61000 and non-volatile memory devices 62000A, 62000B, and 62000C, according to at least one embodiment of the inventive concepts. Referring to FIG. 15, an electronic device 60000 is implemented by a data storage device such as a solid state drive (SSD).

The electronic device 60000 includes non-volatile memory devices 62000A, 62000B, and 62000C and a memory controller 61000 to control a data processing operation of each of the non-volatile memory devices 62000A, 62000B, and 62000C. The electronic device 60000 is implemented by a memory system or a memory module.

Each of the non-volatile memory devices 62000A, 62000B, and 62000C means a non-volatile memory device illustrated in FIG. 1. The non-volatile memory devices 62000A, 62000B, and 62000C store random data. The memory controller 61000 is implemented outside or inside electronic device 60000 according to embodiments. According to at least one example embodiment, the memory controller 61000 may include an embedded memory device that has the same structure and operation as that discussed above with respect to any of the embedded memories in FIGS. 1-9.

Figure 16:
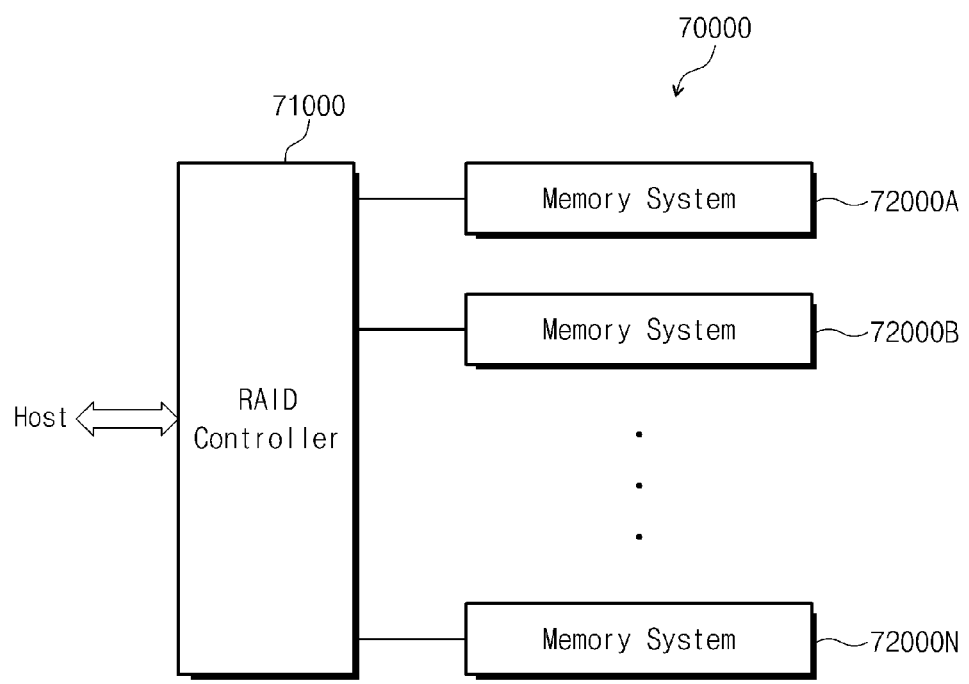
FIG. 16 is a block diagram schematically illustrating a data processing system including an electronic device illustrated in FIG. 15.

FIG. 16 is a block diagram schematically illustrating a data processing system including an electronic device illustrated in FIG. 15. Referring to FIGS. 15 and 16, a data storage device 70000 is implemented by a RAID (Redundant Array of Independent Disks) system. The data storage device 70000 includes a RAID controller 71000 and a plurality of memory systems 72000A to 72000N (N being a natural number).

Each of the memory systems 72000A to 72000N is an electronic device 60000 in FIG. 15. The memory systems 72000A to 72000N form an RAID array. The data storage device 70000 is implemented by a personal computer or an SSD.

During a program operation, the RAID controller 71000 outputs program data output from a host to one of the memory systems 72000A to 72000N according to one selected from a plurality of RAID levels based on RAID level information output from the host.

During a read operation, the RAID controller 71000 transfers data read from one of the memory systems 72000A to 72000N to the host according to one selected from a plurality of RAID levels based on RAID level information output from the host.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An embedded memory device, comprising:
   a mask ROM including a plurality of mask ROM cells and an address decoder configured to decode an address of the plurality of mask ROM cells;
   an e-fuse memory configured to store replacement data and to replace a part of data output by the mask ROM with the replacement data, the e-fuse memory including,
      a plurality of e-fuse memory cells configured to store the replacement data, and
      an e-fuse address selector configured to decode an address of the plurality of e-fuse memory cells and to selectively cause a first portion of the replacement data stored in the plurality of e-fuse memory cells to be output from the embedded memory device in place of a portion of data output from the mask ROM, based on the decoding result,
   the first portion having a number of bits greater than 1 bit and less than a output bandwidth of the mask ROM.

2. The embedded memory device of claim 1, wherein the embedded memory device is configured such that a band width of the mask ROM is different from that of the e-fuse memory.

3. The embedded memory device of claim 2, wherein the embedded memory device is configured such that the band width of the e-fuse memory is less than that of the mask ROM.

4. The embedded memory device of claim 1, further comprising:
   a plurality of multiplexers configured to receive data from the mask ROM and the e-fuse memory.

5. The embedded memory device of claim 4, wherein the embedded memory device is configured such that the plurality of multiplexers is controlled by the e-fuse address selector.

6. The embedded memory device of claim 4, wherein the embedded memory device is configured such that the plurality of multiplexers selects first data, the first data being at least one of the data received from the mask ROM and the data received from the e-fuse memory, and outputs the selected data externally from the embedded memory device.

7. The embedded memory device of claim 6, wherein the embedded memory device is configured such that a band width of the data output from the embedded memory device is equal to that of the mask ROM.

8. The embedded memory device of claim 1, wherein the embedded memory device is configured such that band widths of data of the e-fuse memory are variable according to an address.

9. A memory controller comprising:
   an embedded memory device, the embedded memory device including,
      a mask ROM configured to store a firmware code;
      an e-fuse memory configured to store replacement data and to replace a part of code data output by the mask ROM with the replacement data; and
      a plurality of multiplexers configured to receive code data from the mask ROM and the e-fuse memory and to selectively cause a first portion of the replacement data stored in the e-fuse memory to be output from the embedded memory device in place of a portion of data output from the mask ROM,
   the first portion having a number of bits greater than 1 bit and less than a output bandwidth of the mask ROM.

10. The memory controller of claim 9, wherein the memory controller is configured such that a band width of the mask ROM is different from that of the e-fuse memory.

11. The memory controller of claim 9, wherein the memory controller is configured such that a band width of the e-fuse memory is less than that of the mask ROM.

12. The memory controller of claim 9, wherein the memory controller is configured such that data of the mask ROM is distributed to the plurality of multiplexers.

13. The memory controller of claim 9, wherein the memory controller is configured such that the e-fuse memory controls the plurality of multiplexers, the plurality of multiplexers being configured to selectively output data of the mask ROM or data of the e-fuse memory.

14. The memory controller of claim 9, wherein the memory controller is configured such that a band width of data provided from the plurality of multiplexers is equal to that of the mask ROM.

15. The memory controller of claim 9, wherein the memory controller is configured such that the embedded memory device receives an address from the memory controller, the address being provided to the mask ROM and the e-fuse memory.

16. An embedded memory device, comprising:
a mask ROM configured to receive an address and output first data corresponding to the address;
an e-fuse memory configured to receive the address, the e-fuse memory including,
a plurality of data units, and
an address selector configured to select, based on the address, at least one of the plurality of data units to output second data; and
one or more multiplexers configured to receive the first data and the second data, and to output third data by replacing at least a first portion of the first data with at least a portion of the second data,
the first portion having a number of bits greater than 1 bit and less than a output bandwidth of the mask ROM.

17. The embedded memory device of claim 16, wherein the one or more multiplexers output the third data based on one or more selection signals generated by the address selector.

* * * * *